(12) United States Patent
Abousleman

(10) Patent No.: US 6,717,990 B1
(45) Date of Patent: Apr. 6, 2004

(54) COMMUNICATION SYSTEM AND METHOD FOR MULTI-RATE, CHANNEL-OPTIMIZED TRELLIS-CODED QUANTIZATION

(75) Inventor: Glen Patrick Abousleman, Scottsdale, AZ (US)

(73) Assignee: General Dynamics Decision Systems, Inc., Scottsdale, AZ (US)

( * ) Notice: Subject to any disclaimer, the term of this patent is extended or adjusted under 35 U.S.C. 154(b) by 0 days.

(21) Appl. No.: 09/478,058

(22) Filed: Jan. 5, 2000

(51) Int. Cl.[7] .............................................. H04L 5/12
(52) U.S. Cl. ...................... 375/265; 375/261; 375/262; 375/263; 375/264; 375/298; 341/200; 704/222; 704/230
(58) Field of Search ................................ 375/261, 262, 375/263, 264, 265, 298; 341/200; 704/222, 230

(56) References Cited

U.S. PATENT DOCUMENTS 6,504,877 B1 * 1/2003 Lee ............................ 375/265

OTHER PUBLICATIONS

Tuyet–Trang Lam, Lina J. Karam, Glen P. Abousleman "Robust Image Coding Using Perceptually–Tuned Channel–Optimized Trellis–Coded Quantization", Circuits and Systems, 1999, 42nd Midwest Symposium on, vol. 2, Aug. 8–11, 1999, pp. 1131–1134.*
An article entitled "Trellis Coded Quantization Of Memoryless And Gauss–Markov Sources" by Michael W. Marcellin and Thomas R. Fischer from IEEE Transactions On Communications, vol. 38, No. 1, Jan. 1990.
An article entitled "Trellis–Coded Quantization Designed For Noisy Channels" by Min Wang and Thomas R. Fischer from 1994 IEEE.
An article entitled "The Design Of Joint Source And Channel Trellis Waveform Coders" by Ender Ayanoglu and Robert M. Gray from 1987 IEEE.

* cited by examiner

*Primary Examiner*—Stephen Chin
*Assistant Examiner*—Guillermo Munoz
(74) *Attorney, Agent, or Firm*—Lowell W. Gresham; Jordan M. Meschkow; Meschkow & Gresham, PLC

(57) ABSTRACT

A communication system (20) employs fixed rate channel-optimized, trellis-coded quantization (COTCQ) at a plurality of diverse encoding bit rates. COTCQ is performed through a COTCQ encoder (40) and COTCQ decoder (54). The COTCQ encoder and decoder (40,54) each include a codebook table (62) having at least one codebook (64) for each encoding bit rate. Each codebook (64) is configured in response to the bit error probability of the channel (26) through which the communication system (20) communicates. The bit error probability influences codebooks through the calculation of channel transition probabilities for all combinations of codewords (90) receivable from the channel (26) given all combinations of codewords (90) transmittable through the channel (26). Channel transition probabilities are responsive to base channel transition probabilities and the hamming distances between indices for codewords within subsets of the transmittable and receivable codewords.

35 Claims, 7 Drawing Sheets

TRANSITION PROBABILITY MATRIX (R = 5)

WHERE, $\overline{P}_b = 1 - P_b$

COMMUNICATION SYSTEM AND METHOD FOR MULTI-RATE, CHANNEL-OPTIMIZED TRELLIS-CODED QUANTIZATION

TECHNICAL FIELD OF THE INVENTION

The present invention relates to the fields of data compression and data communication.

BACKGROUND OF THE INVENTION

The communication industries have felt a continuous need to use communication channels more efficiently. In other words, a need has existed and continues to exist for using the smallest amount of channel bandwidth in accurately conveying the largest amount of information. The techniques of data compression and error correction encoding have evolved to address this need. However, to some extent data compression and error correction encoding work at cross purposes in conventional communication systems.

In addition to the need to use communication channels more efficiently, those involved in mobile and portable communications have felt other needs peculiar to these types of communications. For example, mobile and portable communications often use battery-powered devices which communicate using radio frequency (RF) channels. Such devices desirably consume as little power as possible so that smaller batteries may be used and the batteries may operate as long as possible on a single charge. Moreover, the communication links should be as robust as practical because mobile and portable devices are likely to experience a wide variation in communication signal quality due to multipath, signal blockage, interference, and the like. The signal quality is more difficult to control in mobile and portable communications than in other types of communications.

Data compression re-characterizes an original data set using less data than included in the original data set but in a manner that allows as much accuracy as possible in reconstruction of the original data. Data compression is often employed on human-perceivable data, such as video images or audio, that typically include a large amount of redundant content which the compression removes and which need not be perfectly reconstructed. If the original data set represents an image or audio, tremendous amounts of compression can be achieved while still having the reconstructed image or audio be readily perceivable. Compression and reconstruction are highly desirable in communication systems because a much smaller quantity of compressed data needs to be transmitted through a communication channel than would be required to transmit the original data set.

Error correction encoding, hereinafter referred to as forward error correction (FEC) encoding, typically involves convoluting communicated data and embedding redundant information so that a receiver can correct the transmission even if errors occur. FEC encoding requires a greater quantity of data to be communicated through a channel than would be required if FEC encoding were omitted. To this extent, FEC encoding is undesirable and works at cross purposes to compression. However, relatively small amounts of FEC encoding introduce coding gain that can more than offset the cost of transmitting additional redundant data. In general, FEC encoding maintains at least a minimum bit error rate while channel conditions deteriorate. However, when channel conditions deteriorate to some point, the encoding utterly fails and massive increases in bit errors pass through a FEC decoder. Viewers or listeners perceive FEC encoded and decoded information as being of good quality until the communication channel deteriorates to a point where the information suddenly becomes unintelligible. In mobile and portable communications where signal quality is difficult to control, this feature of FEC encoding is undesirable because devices can routinely encounter communication signal quality beneath the point where information suddenly goes from being readily perceivable to unintelligible.

Channel-optimized quantization refers to a merging of the compression and FEC encoding functions. In particular, quantization codebooks are designed to integrate the FEC encoding and compression functions by controlling compression in such a way that the small amount of redundant information which invariably remains after compression is useful for error correction. As a result, little or no need exists to reduce payload data rates by including redundant FEC information. Moreover, by integrating the two functions, any degradation in reconstructed information due to worsening channel conditions may be made more gradual and intelligible information may be recovered under worse channel conditions because compression decisions are based, at least in part, on channel conditions.

The compression of data typically involves a quantizer, several types of which have been developed. For example, a scalar quantizer is a simple construction that is well-suited to mobile and portable communications, but tends to achieve poor rate-distortion performance. Channel-optimized scalar quantizers have been developed, but nevertheless demonstrate the poor performance of scalar quantizers generally.

A vector quantizer improves upon the poor rate-distortion performance of scalar quantizers, but the vector quantizer tends to be too computationally complex for practical implementation in mobile and portable communications. In addition, the vector quantizer is characterized by having a single bit transmission error affect a large block of data, a feature likewise highly undesirable in mobile and portable communications due to the wide variation in communication signal quality. The exaggerated effect from a single bit error can be somewhat ameliorated with increased amounts of FEC encoding. However, increased FEC encoding requires the transmission of more data, and a primary goal of data compression is to transmit as little data as possible. Channel-optimized vector quantizers have been developed, but computational complexity worsens, and the exaggerated effects from single bit errors persists.

Trellis-coded quantization appears to compare favorably with vector quantization in performance, is less computationally complex to implement, and may be more robust because single bit errors in the coded bit stream tend to affect only a few outputs.

Quantizers and FEC encoders are characterized by an encoding bit rate parameter. Encoding bit rate refers to the increase or decrease in data quantity imposed by the quantizer, which decreases the data quantity, or encoder, which increases the data quantity.

Quantizers are also characterized as having a fixed or variable compression rate. With fixed compression rate quantization, a given data set, such as an image expressed as a given number of pixels, is compressed into a preset number of bits known prior to compression computations. With variable rate quantization, the number of bits into which a data set is compressed is unknown before compression computations take place. Variable rate quantization may achieve a greater amount of compression for many data sets because more important features of the data set can be compressed into larger data blocks while smaller data blocks are used for less important features. However, variable rate quantization is nevertheless undesirable, particularly in mobile and portable communications. Variable rate quantization is undesirable because implementation is excessively complex due to extensive buffering and synchronization requirements. Moreover, fixed rate compression can approximate some advantages of variable rate compression when a sufficient quantity of fixed-rate blocks of data are used to communicate a given data set.

Channel-optimized trellis-coded quantization has been developed, but only for very low fixed compression rates (i.e. one or two bits per codeword) and only using a memory intensive and computationally complex implementation which would achieve little benefit over variable rate compression. Unfortunately, a practical communication system which employs channel-optimized trellis-coded quantization should operate at a wide variety of fixed rates and at fixed rates much greater than two in order to achieve useful amounts of compression.

Therefore, what is needed is a communication system and method for multi-rate channel-optimized trellis-coded quantization that is suitable for application in mobile and portable communication devices.

BRIEF DESCRIPTION OF THE DRAWINGS

A more complete understanding of the present invention may be derived by referring to the detailed description and claims when considered in connection with the figures, wherein like reference numbers refer to similar items throughout the figures, and:

DETAILED DESCRIPTION OF A PREFERRED EMBODIMENT

Figure 1:
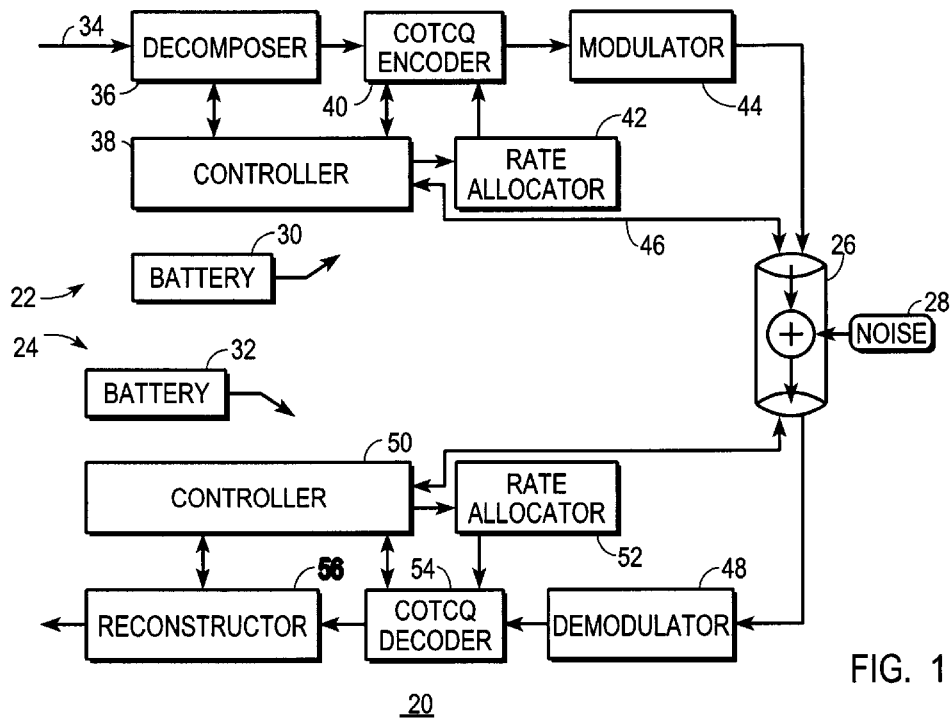
FIG. 1 shows a block diagram of a communication system which implements multi-rate channel-optimized trellis-coded quantization (COTCQ) in accordance with the teaching of the present invention.

FIG. 1 shows a block diagram of a communication system 20 which implements multi-rate channel-optimized trellis-coded quantization (COTCQ) in accordance with the teaching of the present invention. System 20 includes a transmitter portion 22 and a receiver portion 24. Transmitter portion 22 transmits into and receiver portion 24 receives from a communication channel 26. Invariably, the signal transmitted into channel 26 is corrupted by noise 28, illustrated in FIG. 1 as additive Gaussian white noise (AGWN). Consequently, some bit error probability $P_b$ exists that the signal will be incorrectly received by receiver portion 24.

Communication system 20 is configured using the assumption that channel 26 is a memoryless, binary symmetric channel. In other words, COTCQ codebooks (discussed below) are designed using the assumption that an error in one received bit has substantially no influence on whether other received bits will likewise be in error and using the assumption that the likelihood of a bit transmitted as a one being received as a zero is the same as that of a bit transmitted as a zero being received as a one. Of course, these assumptions may not precisely describe channel 26, but beneficial results may nevertheless be achieved even when channel 26 is not precisely a memoryless, binary symmetric channel.

In the preferred embodiment, either one or both of transmitter and receiver portions 22 and 24 are mobile or portable devices. As a mobile or portable device, substantially all components therein are energized by batteries 30 or 32. Accordingly, it is desirable that computational complexities for transmitter and receiver portions 22 and 24 are as low as possible so that power consumption is correspondingly low. In addition, channel 26 is an over-the-air, radio frequency (RF) communication channel to accommodate relative movement between transmitter and receiver portions 22 and 24.

Transmitter portion 22 includes a node 34 at which to-be-communicated data are received. Digitized image data, whether still images or video, represent a form of to-be-communicated data that may receive particular benefit from communication system 20, but other types of data, such as audio or computer data, may likewise benefit from communication system 20.

Node 34 couples to a decomposer 36. At decomposer 36, the to-be-communicated data are decomposed into transform coefficients using a conventional transformation technique, such as wavelet decomposition, Fourier, discrete cosine, or other transformation technique known to those skilled in the art. In the preferred embodiment, to-be-communicated data characterize an image, and decomposer 36 performs a wavelet transformation which transforms the image into around twenty-two sub-bands, each of which is characterized by its own block of samples.

A controller 38 couples to decomposer 36 and to a channel-optimized trellis-coded quantization (COTCQ) encoder 40, a rate allocator 42, and optionally to a modulator 44 (interconnection not shown). An output of decomposer 36 and an output of rate allocator 42 couple to COTCQ encoder 40, and an output of COTCQ encoder 40 couples to modulator 44. An output of modulator 44 represents the communication signal that is broadcast into channel 26. Likewise, a side information link 46 provides a communication signal into channel 26 originating from controller 38. Side information link 46 does not experience encoding through COTCQ encoder 40 and may (not shown) or may not pass through modulator 44 prior to application into channel 26. In the preferred embodiment, battery 30 energizes each of decomposer 36, controller 38, COTCQ encoder 40, rate allocator 42, and modulator 44. Those skilled in the art will appreciate that one or more of components 36, 38, 40, 42 and 44 may be implemented within a digital signal processor.

Controller 38 calculates statistics over the sample blocks for the sub-bands generated by decomposer 36. The sub-bands are normalized by subtracting their mean, with only the lowest frequency sub-band being assumed to have a non-zero mean, and dividing by their respective standard deviations.

The sample blocks for the various sub-bands are associated with differing encoding bit rates using a conventional technique in controller 38 and rate allocator 42. Encoding bit rate refers to the number of compressed encoded bits generated per input sample by COTCQ encoder 40. Generally, higher energy sub-bands are associated with higher encoding bit rates while lower energy sub-bands are associated with lower encoding bit rates. In the preferred embodiment, the approximately twenty-two sub-bands generated by decomposer 36 are allocated to approximately eight fixed encoding bit rates, ranging from a rate of one bit per sample to eight bits per sample, through the operation of rate allocator 42. Some sub-bands share a common fixed encoding bit rate with other sub-bands, but no single encoding bit rate must be associated with more than one sub-band.

The precise number of fixed encoding bit rates to be associated with transform coefficients is not an important factor. However, the number of rates should be greater than two to effectively compress and reconstruct the to-be-communicated data and is preferably greater than seven. The rate allocation process of rate allocator 42 and controller 38 causes the formation of sample sets, wherein each sample set includes sample blocks from one or more of the transform coefficients generated by decomposer 36. All samples in each sample set for each fixed encoding bit rate are encoded together within COTCQ encoder 40.

Controller 38 also causes the transmission of the mean of the lowest frequency sub-band and the standard deviations of all the approximately twenty-two sub-bands over side information link 46. In addition, an initial trellis state for each sub-band and a target compression ratio may be transmitted over side information link 46. This side information represents a very small fraction of the total data transmitted from transmitter portion 22 to receiver portion 24 for a single image. This side information may be quantized and/or forward error correction encoded in any convenient and reasonably computationally efficient manner. Since it represents a small fraction of the total amount of data required to convey a single image, the encoding efficiency of the side information is no more than a minor concern.

COTCQ encoder 40 is discussed in more detail below. Generally, COTCQ encoder compresses the to-be-communicated data which have been decomposed with sub-bands grouped together and associated with differing fixed rates. COTCQ encoder 40 compresses at the indicated fixed encoding bit rates in a channel-optimized manner. Those skilled in the art will appreciate that optimization in this context does not imply an absolutely perfect or best possible solution. Rather, optimization indicates that the channel characteristics, such as the bit error probability $P_b$ of channel 26, have been considered in the compression and that a compression solution is provided which is different from and desirably better than that which would be provided if the channel characteristics where not considered.

Since the channel characteristics are considered in the compression process of COTCQ encoder 40, preferably no error correction encoding is applied to the encoded data output from COTCQ encoder 40. In particular, modulator 44 desirably refrains from applying error correction to the encoded data from COTCQ encoder 40 because such error correction typically comes at the expense of transmitting additional redundant data through channel 26. Moreover, conventional error correction techniques which minimize the amount of additional redundant data are as likely to cause reception quality to deteriorate as to improve, are likely to cause a sudden deterioration in reception quality as bit error probability $P_b$ increases, and are likely to provide an unintelligible reception quality at lower bit error probability $P_b$ than if omitted.

Receiver portion 24 is substantially the inverse of transmitter portion 22. A demodulator 48 receives the communication signal from channel 26. A controller 50 couples to a rate allocator 52, a COTCQ decoder 54, and a reconstructor 56. Demodulator 48, rate allocator 52, COTCQ decoder 54, and reconstructor 56 perform inverse operations to those discussed above for modulator 44, rate allocator 42, COTCQ encoder 40, and decomposer 36, respectively.

While the below-presented discussion concentrates on transmitter portion 22, those skilled in the art will readily translate the transmitter portion 22 teaching to the inverse functions performed in receiver portion 24. Those skilled in the art will appreciate that the inverse functions may be simple when compared to the corresponding transmitter function. For example, a Viterbi decoding process carried out in COTCQ decoder 54 as an inverse operation to a below-discussed Viterbi encoding process may be implemented in a relatively computationally simple manner using a variety of table look-up operations and the same codebooks (discussed below) which are used by COTCQ decoder 54. Such simplicity is desirable for mobile and portable communication devices because components which consume relatively little power can be used.

Figure 2:
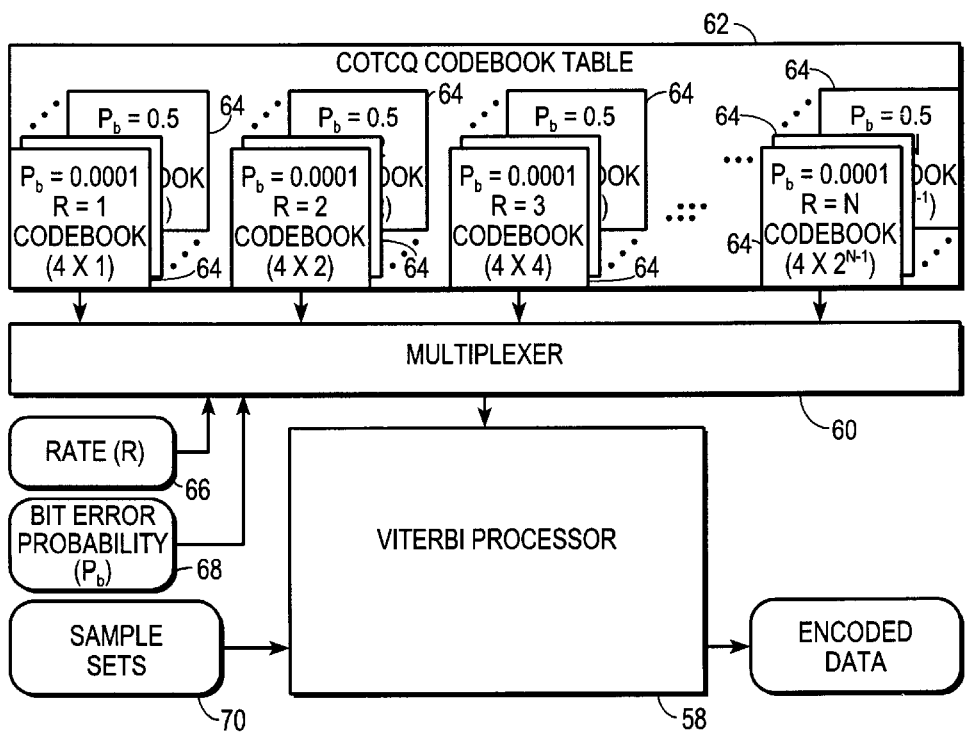
FIG. 2 shows a block diagram of an exemplary COTCQ encoder portion of the communication system of FIG. 1.

FIG. 2 shows a block diagram of an exemplary COTCQ encoder 40. COTCQ encoder 40 includes a Viterbi processor 58, which couples to a multiplexer 60, which in turn couples to a COTCQ codebook table 62. COTCQ codebook table 62 is a memory structure which is configured to include a plurality of codebooks 64. Each codebook 64 is configured for a particular encoding bit rate R and a particular channel 26 (FIG. 1) bit error probability $P_b$.

Rate R and bit error probability $P_b$ parameters 66 and 68, respectively, are supplied to multiplexer 60 so that a single selected codebook 64 is made available to Viterbi processor 58. Sample sets 70 are provided to Viterbi processor 58. As discussed above, each sample set includes all transform coefficient samples from decomposer 36 (FIG. 1) which have been associated together for compression at a common fixed encoding bit rate. The rate R changes for different sample sets, and the bit error probability $P_b$ may change from time-to-time, but the rate R and bit error probability $P_b$ desirably remain constant while Viterbi processor 58 is operating on a given sample set 70.

In one embodiment, only one codebook 64 is included for each rate at which sample sets 70 are to be encoded by COTCQ encoder 40. These codebooks 64 are configured for only a worst-case channel bit error probability $P_b$ expected for channel 26. Beneficial results are achieved even when channel 26 exhibits a bit error probability $P_b$ much less than this worst-case.

Figure 3:
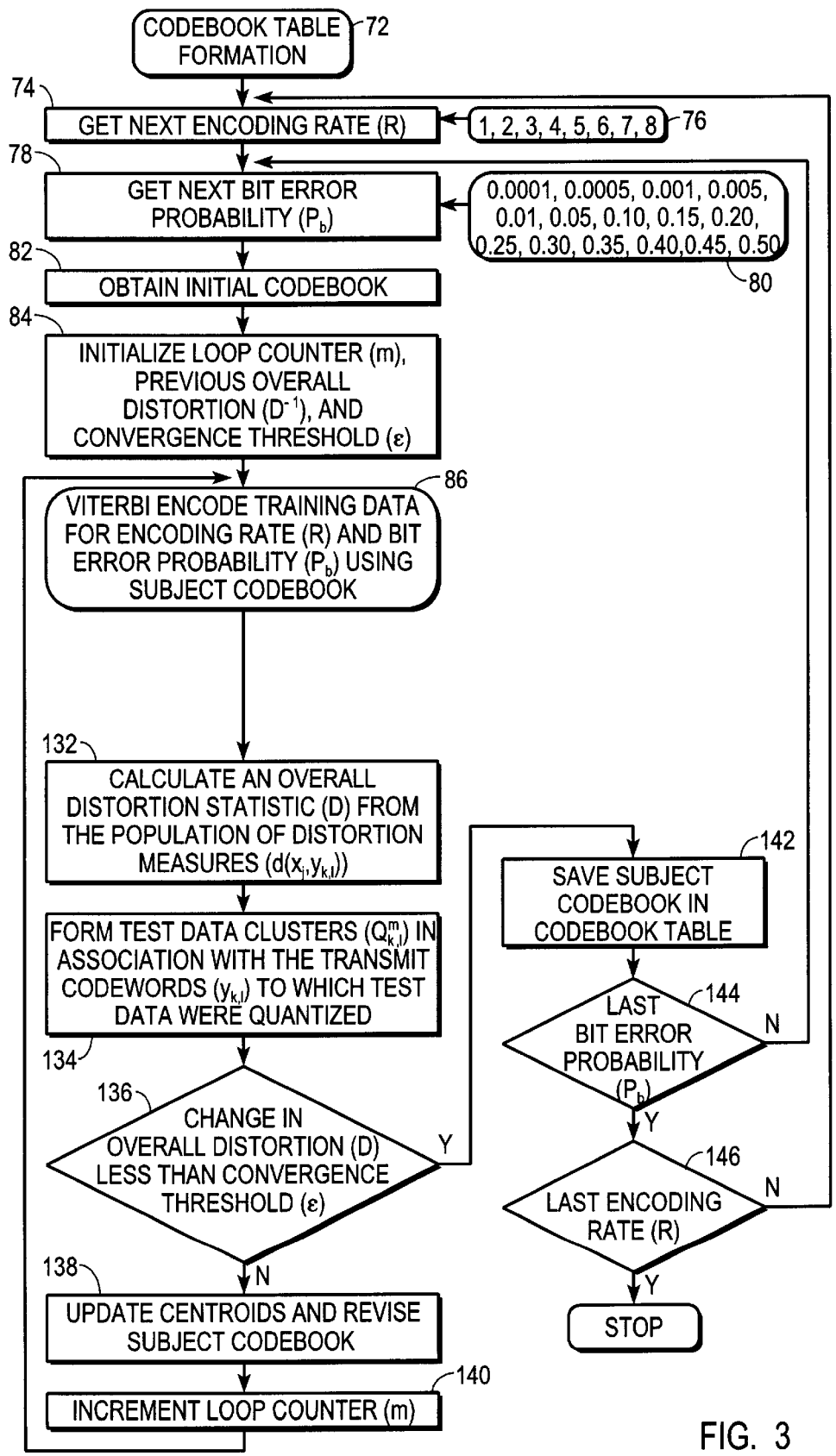
FIG. 3 shows a flow chart of an exemplary codebook table formation process performed to make codebooks included in a COTCQ codebook table portion of the COTCQ encoder of FIG. 2.

FIG. 3 shows a flow chart of an exemplary codebook table formation process 72 performed to make the codebooks 64 stored in codebook table 62. Process 72 is performed "off-line," before COTCQ encoder 40 (FIG. 2) compresses real data for communication over channel 26 (FIG. 1). Process 72 may be performed using COTCQ encoder 40 (FIG. 2) or a suitable general purpose computer (not shown) programmed to simulate the operation of COTCQ encoder 40. For convenience, the below-presented discussion assumes that COTCQ encoder 40 is used in process 72, but those skilled in the art will appreciate that this is no requirement.

Process 72 includes a task 74 in which an encoding bit rate (R) is obtained from a pool 76 of encoding bit rates. FIG. 3 illustrates pool 76 of encoding bit rates as including rates of from one bit per sample to eight bits per sample in one bit increments, but this precise configuration for pool 76 of encoding bit rates is not a requirement. Process 72 eventually repeats task 74 in a programming loop and obtains an encoding bit rate R from pool 76 which has not previously been obtained. In a first iteration of task 74 the rate of one (i.e., R=1) may be obtained.

After task 74, a task 78 gets a next bit error probability $P_b$ from a pool 80 of bit error probabilities. FIG. 3 illustrates pool 80 as including fifteen different bit error probabilities ranging from a low of 0.0001 to a high of 0.50, but this precise configuration is not a requirement. Desirably, task 78 selects the lowest bit error probability $P_b$ which has not previously been evaluated.

Following task 78, a task 82 obtains an initial codebook for the rate R selected above in task 74. The initial codebook is modified in subsequent tasks by process 72 using a type of K-means algorithm into a codebook 64 which is acceptable for the bit error probability $P_b$ selected above in task 78. For all iterations of task 82 within process 72 other than the first iteration, task 82 obtains a codebook 64 which was just formed for the same rate R but a bit error probability $P_b$ as close as possible to but lower than the current bit error probability $P_b$. For the first iteration, task 82 may select a codebook configured for the current rate R and a bit error probability $P_b$ of 0.0. Such a codebook represents a conventional non-channel-optimized trellis-coded quantizer codebook formed using the assumption of error-free transmission and obtained using conventional trellis-coded quantizer techniques. The use of an initial codebook configured for the same rate R but only a slightly lower bit error probability $P_b$ is desirable because it improves the odds of the K-means algorithm converging to a codebook solution for the bit error probability $P_b$ of the current codebook.

Next, a task 84 performs initialization operations for a programming loop that will repetitively form different codebooks until changes in overall distortion from the codebooks appear to be below a predetermined threshold. Thus, task 84 initializes a loop counter (m) which tracks the number of times through this programming loop. A value which characterizes the overall distortion for a previous iteration ($D^{-1}$) of this programming loop is set to a large positive number, and a convergence threshold ($\epsilon$) is chosen.

Following task 84, process 72 repetitively modifies and refines the initial and then revised codebooks until improvement in overall distortion (D) ceases. As a part of this repetitive process, process 72 performs a Viterbi encode process 86 which uses a Viterbi-type algorithm to encode training data for the current encoding bit rate R and bit error probability $P_b$ using the current initial or revised codebook. The training data need not be real data which has been decomposed from an image or other to-be-communicated data but may simply be a random sample set which includes random data expressed as many thousands of samples.

Figure 4:
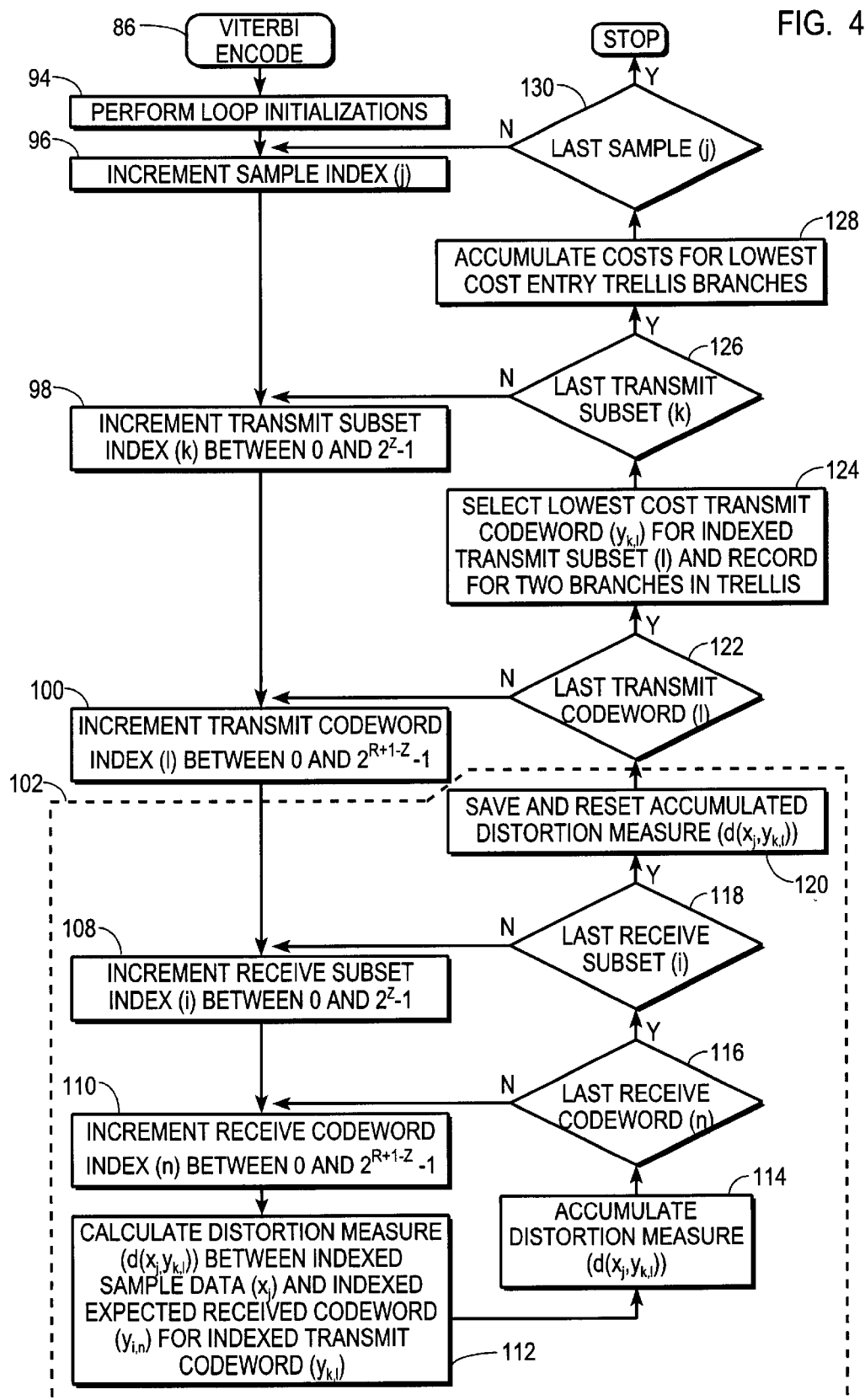
FIG. 4 shows a flow chart of an exemplary Viterbi encode process performed by the codebook table formation process of FIG. 3 and elsewhere.

FIG. 4 shows a flow chart of an exemplary Viterbi encode process 86 performed by the codebook table formation process 72 of FIG. 3 and elsewhere. Viterbi encode process 86 is performed by Viterbi processor 58 (FIG. 2) using a specific codebook 64, specific encoding bit rate R, and bit error probability $P_b$ which are established prior to performing process 86 and which desirably remain constant throughout process 86.

Figures 5, 6:
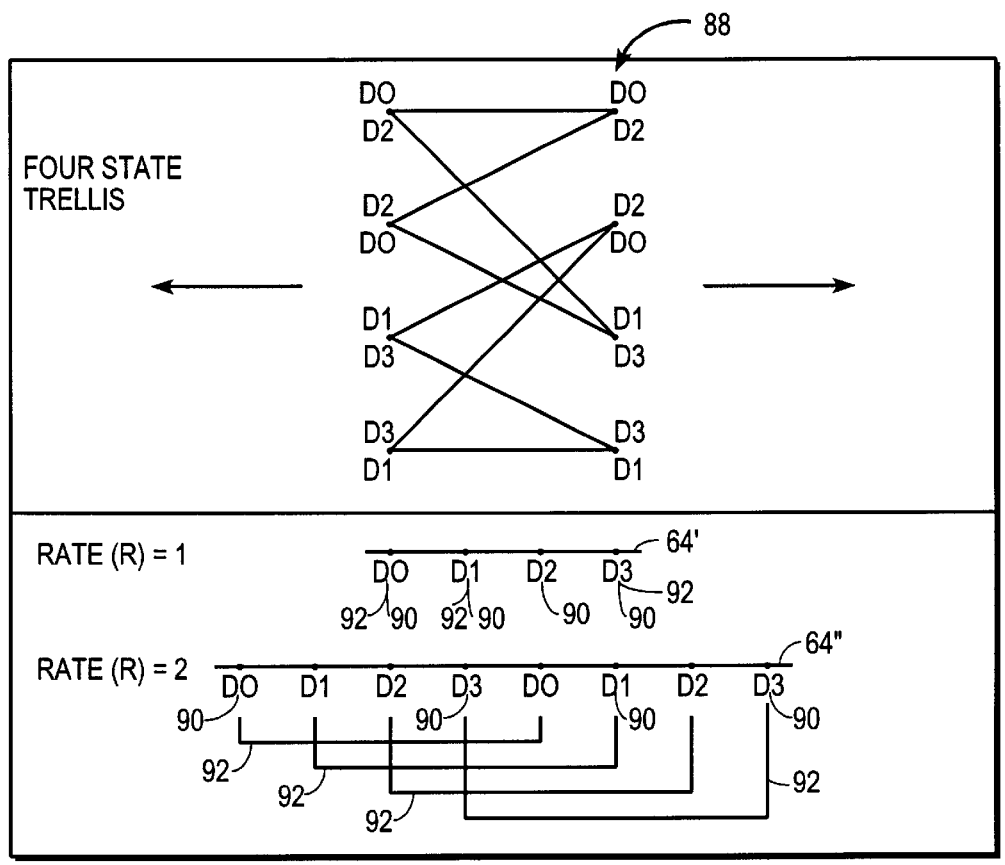
FIG. 5 shows an exemplary four-state trellis implemented through the Viterbi encode process of FIG. 4.
FIG. 6 shows a table of a base transition probability matrix used by the Viterbi encode process of FIG. 4.

FIG. 5 graphically illustrates an exemplary trellis 88 which may be implemented through Viterbi encode process 86. Viterbi encode process 86 performs a Viterbi encoding algorithm in accordance with trellis 88 for $2^Z$ states, where Z is a positive integer. In the preferred embodiment illustrated in FIG. 5, Z=2 so that trellis 88 has four states. While those skilled in the art may adapt trellis 88 to have more states and thereby achieve performance improvements, such performance improvements may be too slight to justify the resulting increase in computational complexity for mobile and portable devices.

FIG. 5 also graphically illustrates exemplary codebooks 64' and 64" for encoding bit rates R of one and two, respectively. Each codebook 64 includes $2^{R+1}$ codewords 90. FIG. 5 also depicts an assignment of codewords 90 to the states of trellis 88. Since trellis 88 has $2^Z$ states, codewords 90 are grouped together into $2^Z$ subsets 92, with $2^{R+1-Z}$ codewords per subset 92. For the preferred embodiment where Z=2, at encoding bit rate R=1, only one codeword 90 is included in each subset 92. In other words, each codeword 90 is its own subset 92. For an encoding bit rate R=2, two codewords are included in each subset 92. Where Z=2 and encoding bit rate R=8 (not shown), each of four subsets 92 includes one hundred twenty eight codewords 90.

Referring to FIGS. 4 and 5, in a task 94, Viterbi encode process 86 performs loop initializations for a programming loop that will be repeated once for each sample in the current sample set 70 (FIG. 2). Thus, the loop initializations performed in task 94 will be used for all samples in the sample set. The loop initializations of task 94 are discussed in more detail below for a specific embodiment of process 86 which is more beneficial for use when COTCQ encoder 40 (FIGS. 1 and 2) operates in real time to encode real data than the training sequence.

Following task 94, a task 96 increments a sample index (j) to point to the next sample within the current sample set 70.

Next, a task 98 increments a transmit subset index (k). Since codewords 90 are grouped into $2^Z$ subsets 92, task 98 increments index k between the values of zero and $2^Z-1$ in increments of one so that index k identifies a single specific one of subsets 92. Furthermore, index k identifies a single specific subset 92 of codewords 90 which is transmittable from transmitter portion 22 (FIG. 1) as distinguished from codewords 90 which are receivable at receiver portion 24 (FIG. 1). Due to the presence of noise in channel 26 (FIG. 1), as characterized through bit error probability $P_b$, a transmitted codeword 90 may not be the same as a received codeword 90.

After task 98, a task 100 increments a codeword index (l). Since each subset 92 includes $2^{R+1-Z}$ codewords 90, task 100 increments index l between the values of zero and $2^{R+1-Z}-1$ in increments of one so that index l identifies a single specific codeword 90 within the subset 92 identified by index k. As with index k, index l identifies a codeword 90 which is transmittable from transmitter portion 22 as distinguished from codewords 90 which are receivable at receiver portion 24.

Following task 100, process 86 performs a transmittable codeword set of calculations 102 denoted within a dotted line box in FIG. 4. Transmittable codeword set of calculations 102 is performed once for each of the $C=2^{R+1}$ transmittable codewords 90 included in the current codebook 64 then repeated for each of the J samples in the current sample set 70 (FIG. 2).

In general, transmittable codeword set of calculations 102 determines a distortion measure $d(x_j, y_{k,l})$ characterizing all codewords 90 which may be received when a given codeword 90 identified by indices k and l is transmitted. The distortion measure is determined with respect to the current sample being evaluated.

More particularly, consider an input sample sequence $X = \{x_j\}_{j=1}^{J}$ of sample set 70, where J denotes the number of samples in the input sample sequence X. Let $y = \{x_{k,l}\}$ be the set of codewords, and $y_{k,l}$, $0 \leq k < 4$, $0 \leq l < 2^{R+1-Z}$, denotes the codeword corresponding the $l^{th}$ codeword of the $k^{th}$ subset 92. The distortion measure between $x_j$ and $y_{k,l}$ calculated by transmittable codeword set of calculations 102 is:

$$d(x_j, y_{k,l}) = \sum_{i=\phi}^{N_1-1} \sum_{n=o}^{N_2-1} P_{i,n|k,l}(x_j - y_{i,n})^2 \quad \text{EQ. 1}$$

where, $N_1 = 2^Z$
$N_2 = 2^{R+1-Z}$, and
$P_{i,n|k,l} = \Pr(y_{i,n} \text{ is received}/y_{k,l} \text{ is sent})$.

Figure 7:
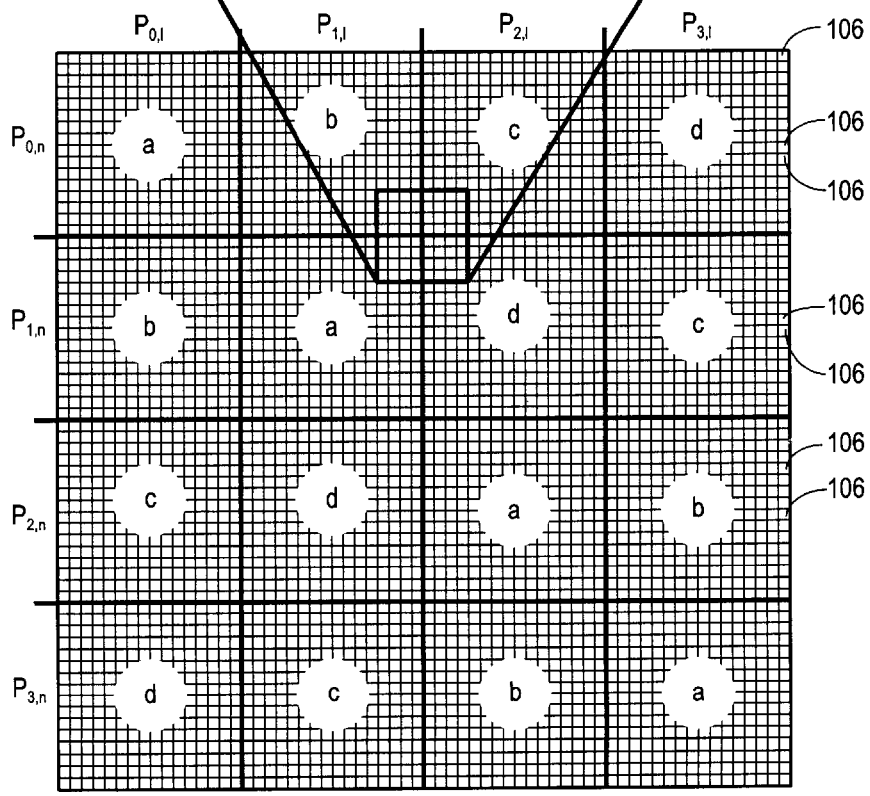
FIG. 7 shows an exemplary transition probability matrix for a rate of five.

The term $P_{i,n|k,l}$ is called a channel transition probability. FIG. 6 shows a table of a base transition probability matrix 104 used by the Viterbi encode process 86. The base transition probability matrix 104 sets forth channel transition probabilities 106 for a situation where the encoding bit rate R=1. FIG. 7 shows an exemplary transition probability matrix 104 for an encoding bit rate of R=5.

Referring to FIGS. 6 and 7, transition probability matrix 104 sets forth probabilities associated with specific codewords 90 (FIG. 5) transitioning channel 26 (FIG. 1). Each codeword 90 has its own column and row in transition probability matrix 104. The columns of transition probability matrix 104 may represent transmittable codewords 90 while the rows may represent receivable codewords 90, or vice-versa. Channel transition probabilities 106 are responsive to bit error probability $P_b$.

Those skilled in the art will appreciate that the structure of trellis 88 (FIG. 5) dictates the branches which transitions between states can follow. Thus, channel transition probabilities 106 are responsive to and reflect trellis 88. In particular, for the preferred four state trellis 88 (i.e., Z=2), a Viterbi decoder operating on the received codewords may exhibit any of the four states at any unit interval depending upon the number of bit errors that may or may not have occurred in the current and two previous unit intervals. For each transmittable codeword 90, transition probability matrix 104 assigns the probabilities that a Viterbi decoder operating on the received codewords will exhibit the various states associated with the possible receivable codewords 90.

As shown in FIG. 6, when the encoding bit rate R=1, the determination of channel transition probabilities 106 is straight forward given a specific trellis 88. As illustrated in FIG. 7, channel transition probabilities 106 become more complicated as the encoding bit rate R increases. However, channel transition probabilities 106 in the preferred embodiment for encoding bit rates R>1 can be determined for any encoding bit rate R by appropriately evaluating correspondence between the base transition probability matrix 104 (FIG. 6) and the hamming distance between the codeword indices n,l, referred to as Hamming(n⊕l) herein. The hamming distance, also called a signal distance, describes the number of digit positions in which the corresponding digits of two binary words of the same length are different. In this situation, the codeword indices n and l are each expressed as binary numbers of length R+1-Z. Specifically, channel transition probabilities 106 may be calculated for any encoding bit rate R and channel bit error probability $P_b$ as follows:

$$P_{i,n|k,l} = P_{i,0|k,0}^{R-1}(1-Pb)^{R+1-Z-\text{Hamming}(l\oplus n)} Pb^{\text{Hamming}(l\oplus n)} \quad \text{EQ. 2}$$

where, $P_{i,0|k,0}^{R=1} = $ base channel transition probability for transmit subset
k and receive subset i.

Referring back to FIG. 4, EQ. 1 presented above is solved for a transmittable codeword identified by transmit subset and codeword indices k,l using channel transition probabilities calculated as set forth in EQ. 2 through the performance of transmittable codeword set of calculations 102. Transmittable codeword set of calculations 102 includes a task 108 which increments a receive subset index i. Since codewords 90 are grouped into $2^Z$ subsets 92, task 108 increments index i between the values of zero and $2^Z-1$ in increments of one so that index i identifies a single specific one of subsets 92. Furthermore, index i identifies a single specific subset 92 of codewords 90 which are receivable at receiver portion 24 (FIG. 1) as distinguished from codewords 90 which are transmittable from transmitter portion 22 (FIG. 1) and identified by index k.

After task 108, a task 110 increments a codeword index n. Since each subset 92 includes $2^{R+1-Z}$ codewords 90, task 110 increments index n between the values of zero and $2^{R+1-Z}-1$ in increments of one so that index n identifies a single specific codeword 90 within the subset 92 identified by index i. As with index i, index n identifies a codeword 90 which is receivable at receiver portion 24 as distinguished from codewords 90 which are transmittable from transmitter portion 22 identified by index l.

Next, a task 112 calculates a single distortion measure for the single receivable codeword identified by receive subset and codeword indices i,n and the single transmittable codeword identified by transmit subset and codeword indices k,l. In the preferred embodiment, the distortion measure characterizes the mean squared error between the input sample $x_j$ and the expected value for the indexed receivable codeword given transmission of the indexed transmittable codeword. As discussed above, this distortion measure is responsive to channel transition probability $P_b$, base channel transition probabilities 106 (FIG. 5), and hamming distance Hamming(n⊕l) between transmit and receive codeword indices l and n.

After task 112, a task 114 accumulates the distortion measure $d(x_j, y_{k,l})$ calculated in task 112 to make a cumulative total, and a query task 116 determines whether the last receive codeword for this transmit codeword and receive subset has been evaluated. In other words, task 116 determines whether the receive codeword 90 indexed by $n=2^{R+1-Z}-1$ has been processed. So long as the last receive codeword for the current transmit codeword and receive subset has not yet been evaluated, program flow loops back to task 110 until all possible receivable codewords for the current transmittable codeword and receive subset have been evaluated. When task 116 discovers the final codeword, a query task 118 determines whether the last receive subset for this transmit codeword has been evaluated. In other words, task 118 determines whether the receive subset 92 indexed by $i=2^Z-1$ has been processed. So long as the last receive subset for the current transmit codeword has not yet been evaluated, program flow loops back to task 108 until all possible receivable subsets have been evaluated.

When task 118 discovers the end of processing for the last receive subset for the current transmittable codeword, a task 120 saves the accumulated total from the previous iteration of task 114 and resets the accumulated total. At this point, a distortion measure $d(x_j, y_{k,l})$ has been calculated for the current transmittable codeword 90, and program flow exits transmittable codeword set of calculations 102. Transmittable codeword set of calculations 102 has been executed C times, once for each codeword 90, where $C=2^{R+1}$.

Following task 120, a query task 122 determines whether the last transmit codeword for this transmit subset has been evaluated. In other words, task 122 determines whether the transmittable codeword 90 indexed by $l=2^{R+1-Z}-1$ has been processed. So long as the last transmittable codeword for the current transmit subset has not yet been evaluated, program flow loops back to task 100 until all possible receivable codewords for all transmittable codewords for the current transmit subset have been evaluated. When task 122 discovers the final transmit codeword for the current transmit subset, a task 124 compares the distortion measures $d(x_j, y_{k,l})$ saved in previous iterations of task 120 to identify the lowest cost transmit codeword. In other words, task 124 finds the lowest distortion measure $d(x_j, y_{k,l})$ over all transmittable codewords 90 and all possible receivable codewords for each of the transmittable codewords within the current transmit subset 92. This lowest cost transmit codeword is recorded in trellis 88 (FIG. 5) in two locations as dictated by the trellis structure.

After task 124, a query task 126 determines whether the last transmit subset has been evaluated. In other words, task 126 determines whether the transmit subset 92 indexed by $k=2^Z-1$ has been processed. So long as the last transmit subset has not yet been evaluated, program flow loops back to task 98 until all possible transmittable subsets have been evaluated. Since transmittable codeword set of calculations 102 is repeated C times for each of C transmittable codewords 90, where $C=2^{R+1}$, transmittable codeword set of calculations 102 is performed at least $C^2$ times before task 126 encounters the last transmittable subset for the current sample.

When task 126 discovers that the last transmittable subset 92 has been evaluated, a task 128 accumulates the costs assigned by task 124 in trellis 88 (FIG. 5). Each state in trellis 88 has a pair of entry branches. For each entry branch pair, task 128 ignores the branch having the higher cumulative cost and forms a cumulative total for the costs of the remaining branch by adding the costs to the previous cumulative total.

Following task 128, a query task 130 determines whether the last sample from the current sample set has been processed. If the last sample has not yet been processed, program flow loops back to task 96 to repeat the evaluation for all possible transmittable and receivable codewords 90 for another sample. If the last sample is detected at task 130, program flow for Viterbi encode process 86 may stop. Transmittable codeword set of calculations 102 is performed at least $JC^2$ times, where J is the number of samples in the sample set.

Referring back to FIG. 3, when Viterbi process 86 stops, program control continues to a task 132 which calculates an overall distortion statistic D. Overall distortion statistic D is determined by reference to the JC, where J=number of samples and C=number of codewords, distortion measures $d(x_j, y_{k,l})$ calculated above in the previous iteration of Viterbi encode process 86. In particular, overall distortion statistic D may be determined as follows:

$$D = \frac{1}{J}\sum_{j=o}^{J-1} d(x_j, y_{k,l})$$ EQ. 3

After task 132, a task 134 forms test data clusters $Q_{k,l}^{(m)} = \{x_j : x_j \in X \text{ is encoded as } y_{k,l}^{(m)}\}$. Test data clusters are formed in association with the transmittable codewords $y_{k,l}$ to which test data were quantized in the previous iteration of Viterbi encode process 86. In other words, all test data encoded using a particular transmittable codeword 90 from the current codebook 64 are clustered together, and one cluster is formed for each transmittable codeword 90.

Next, a query task 136 compares the overall distortion statistic $D^{-1}$ from the previous iteration of process 72 with the overall distortion statistic D from the previous iteration of process 72. In particular, task 136 investigates the inequality $$\frac{D^{(m-1)} - D^{(m)}}{D^{(m)}} < \varepsilon.$$

Unless overall distortion change is less than the convergence threshold $\varepsilon$, another iteration of process 72 is performed for the current rate R and bit error probability $P_b$, and a task 138 is performed.

Task 138 updates the centroids of the clusters formed above in task 134. The centroids are updated by calculating the means of the clusters, as follows:

$$y_{i,n}^{(m+1)} = \frac{\sum xj \in Q_{k,t}^{(m)x,j}}{\sum_{k=o}^{N_1-1}\sum_{l=0}^{N_2-1} P_{i,n|k,l}\|Q_{k,l}\|^{(m)}}$$ EQ. 4

Where $\|Q_{k,l}\|$ is the number of input samples assigned to codeword $y_{k,l}^{(m)}$.

The updated centroids are used as codewords 90 for a revised codebook 64. Following task 138, a task 140 increments the loop counter m, and program flow loops back to process 86 to repeat the Viterbi encoding process for the test data using the revised codebook 64 but for the same rate R and bit error probability $P_b$.

When task 136 discovers that the change in overall distortion D has diminished below the convergence threshold $\varepsilon$, a task 142 saves the subject codebook 64 in codebook table 62 (FIG. 2), and a query task 144 is performed. Task 144 determines whether a codebook 64 for the current encoding bit rate R has been formed for the last bit error probability $P_b$ in pool 80. If another bit error probability $P_b$ remains for which no codebook 64 has been formed, then program flow loops back to task 78 to make another codebook 64 for the current encoding bit rate R but a new bit error probability $P_b$.

When task 144 detects the last bit error probability $P_b$ has been processed, a query task 146 determines whether codebooks 64 have been formed for the last encoding bit rate R in pool 76. So long as additional encoding bit rates R remain, then program flow loops back to task 74 to form codebooks 64 for the additional encoding bit rates R. When task 146 encounters the last encoding bit rate R from pool 76, program flow stops. At this point, codebook table 62 (FIG. 2) is complete and COTCQ encoder 40 (FIG. 2) may be used to encode real data.

In one alternate embodiment, task 142 need not save all codebooks 64. Rather, task 142 saves only the codebooks 64 formed for the highest bit error probabilities $P_b$ in each encoding bit rate R. This alternate embodiment reduces complexity while yielding little to diminished performance.

Figure 8:
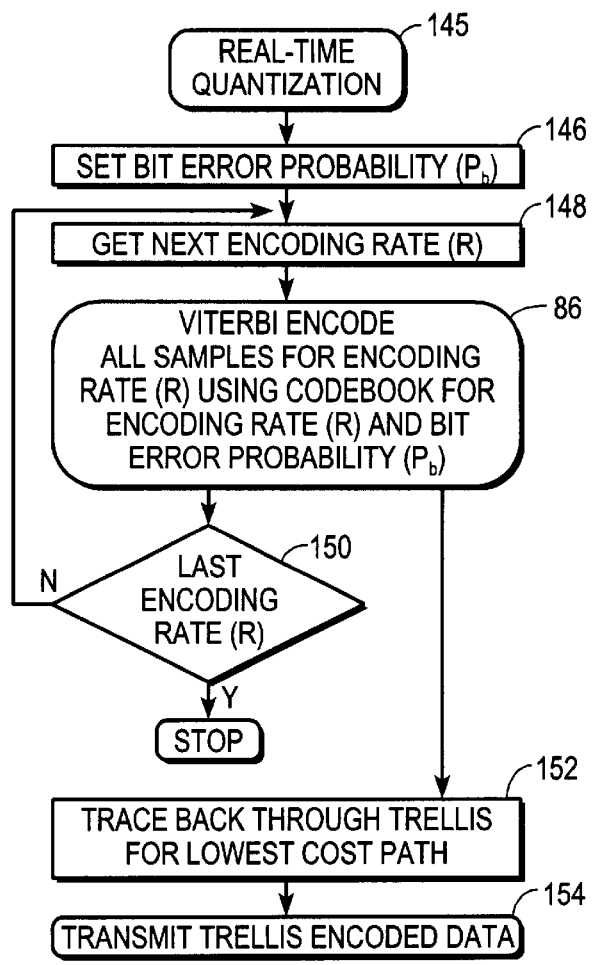
FIG. 8 shows an exemplary real-time quantization process performed by the communication system of FIG. 1.

FIG. 8 shows an exemplary real-time quantization process 145 performed by communication system 20 (FIG. 1). Process 145 is performed by transmitter portion 22 (FIG. 1) of system 20, but receiver portion 24 performs an inverse process which those skilled in the art will readily understand.

Process 145 includes a task 146 wherein the bit error probability $P_b$ 68 (FIG. 2) for channel 26 (FIG. 1) is set. Bit error probability $P_b$ 68 may be determined in any convenient manner. For example, communication system 20 may begin communications at a worst case bit error probability $P_b$, then over time reduce the bit error probability $P_b$ setting until optimal performance appears to have been achieved. In an alternate embodiment, the bit error probability $P_b$ may be set to a predetermined worst case value for channel 26 and held constant throughout a communication session. The setting of bit error probability $P_b$ 68 for channel 26 has the effect of selecting a set of codebooks 64 (FIG. 2) in codebook table 62 (FIG. 2), wherein each of the selected codebooks 64 is designed, as discussed above in connection with FIGS. 3–7, for a different encoding bit rate R.

After task 146, process 145 operates in a programming loop wherein Viterbi encoding process 86 is repeated for different sample sets 70 (FIG. 2), where each of the different sample sets is encoded at a different encoding bit rate R. Thus, a task 148 specifies the next encoding bit rate R at which Viterbi encoding process 86 will encode the next sample set 70. The next encoding bit rate R may be obtained from a pool of encoding bit rates R similar to pool 76 (FIG. 3). Specification of the next encoding bit rate R, when considered with the bit error probability $P_b$ set above in task 146, has the effect of selecting a single codebook 64 from codebook table 62.

After task 148, Viterbi encode process 86, discussed above in connection with FIGS. 4–7, is performed. This time, Viterbi process 86 is performed on a set of real samples rather than training data. Viterbi encode process 86 performs channel-optimized trellis-coded quantization for the encoding bit rate R and bit error probability $P_b$ established in the most previous iterations of tasks 148 and 146, respectively. Following process 86, a query task 150 determines whether the sample set 70 for the last encoding bit rate R has been processed by Viterbi encode process 86. So long as sample sets 70 for additional encoding bit rates R remain, program flow loops back to task 148 to process the next encoding bit rate R. When task 150 detects the last encoding bit rate R, processing may cease. At this point the to-be-communicated data has been communicated through channel 26. Of course, real time quantization process 145 may be repeated at any time, and such repetition may take place immediately to communicate video or other real time data.

In parallel with the performance of task 150 and the repetition of task 148 and Viterbi encode process 86, real time quantization process 145 performs tasks 152 and 154 following each iteration of Viterbi encode process 86. Tasks 152 and 154 process the output of the Viterbi encode process 86. In particular, task 152 traces back through trellis 88 which has been constructed for all samples in sample set 70 to find the lowest cost path through the trellis. In other words, for each sample characterized in trellis 88, task 152 specifies the branches associated with the lowest cumulative distortion measures $d(x_j, y_{k,l})$. Following task 152, task 154 causes the trellis encoded data specified by the lowest cost path in task 152 to be transmitted through modulator 44 and channel 26 (FIG. 1).

Referring back to FIG. 1, in receiver portion 24 of communication system 20, the trellis encoded data are received from channel 26, demodulated in demodulator 48, and decoded in COTCQ decoder 54. COTCQ decoder 54 uses the same codebook table 62 as was used by COTCQ encoder 40. In decoding the trellis encoded data, for the most part COTCQ decoder 54 follows the lowest cost path through the trellis and performs table look-up operations using the codebook 64 for the specified encoding bit rate R and bit error probability $P_b$. The table look-up operations provide codewords 90 which represent the output from COTCQ decoder 54. These codewords are supplied to reconstructor 56 with side information, and reconstructor 56 forms a facsimile of the original to-be-communicated data.

As discussed above in connection with FIG. 4, the embodiment of Viterbi encode process 86 presented in flow chart form in FIG. 4 performs distortion measure $d(x_j, y_{k,l})$ calculations in tasks 112 and 114 at least $JC^2$ times in processing a sample set, where J is the number of samples in the sample set, $C=2^{R+1}$, and C represents the number of codewords in the currently specified codebook. While the computational complexity of Viterbi encode process 86 is of small importance in the formation of codebooks 64, computational complexity becomes a more important factor when processing real data rather than training sequences, particularly when such processing occurs in mobile or portable devices. In general, as the number of computations required to perform an operation within a given period of time increases, so does the power consumption. Accordingly, lowering the number of computations likewise lowers the power consumption.

Figure 10:
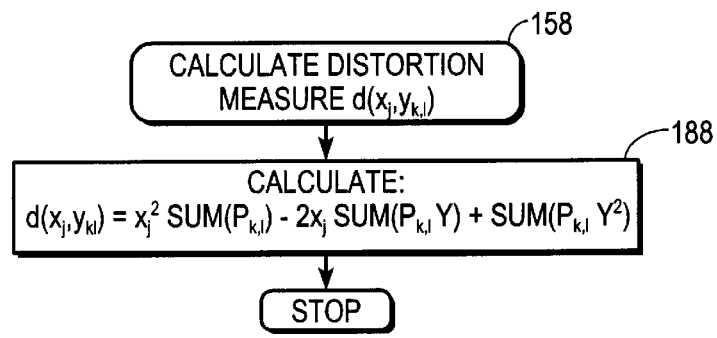
FIG. 10 shows an exemplary calculate distortion measure process performed by the embodiment of the Viterbi encode process of FIG. 4.
Figure 9:
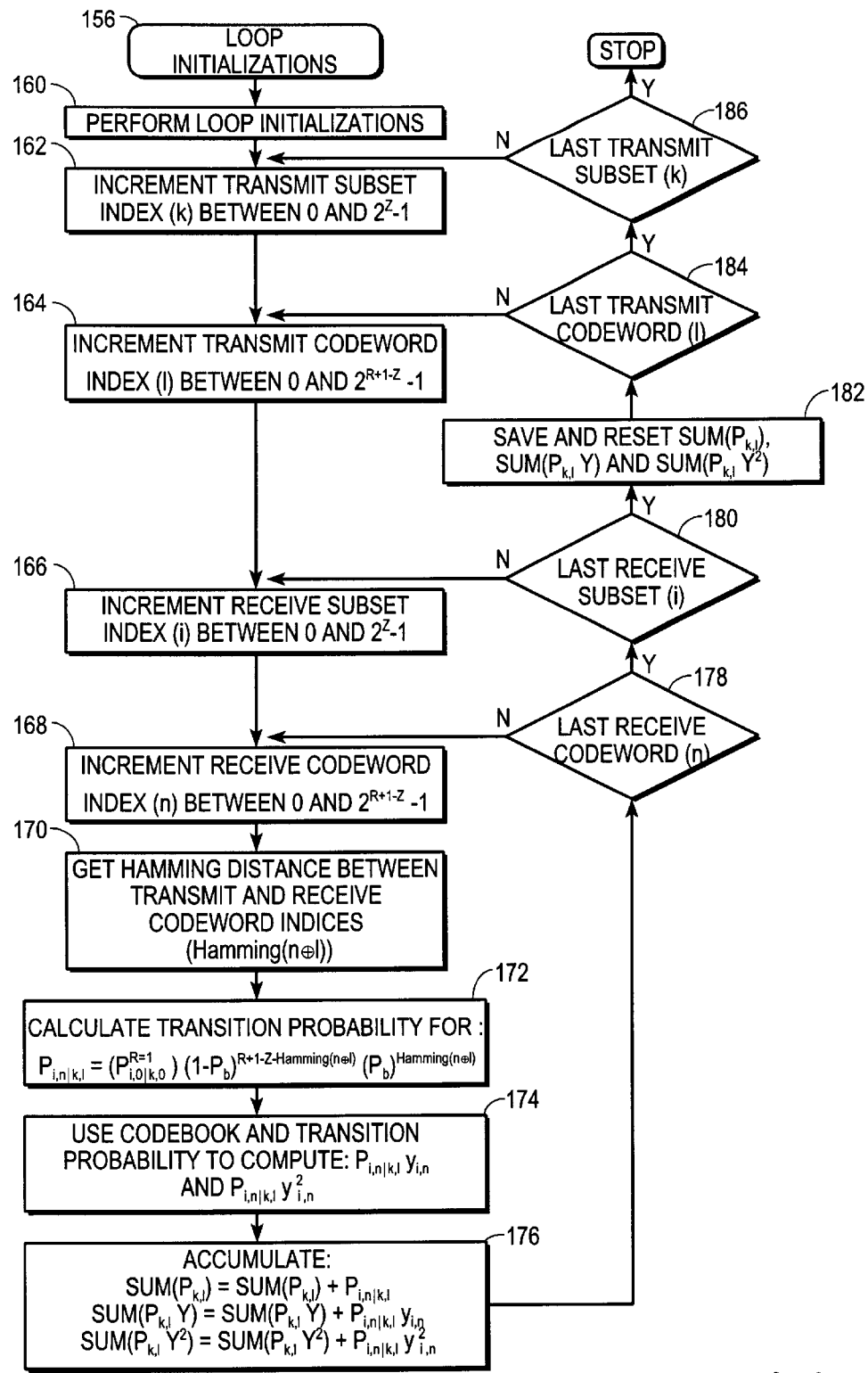
FIG. 9 shows an exemplary loop initializations process performed by one embodiment of the Viterbi encode process of FIG. 4.

FIGS. 9 and 10 present processes which lower the number of computations required of Viterbi encode process 86 (FIG. 4). In particular, FIG. 9 shows an exemplary loop initializations process 156, and FIG. 10 shows an exemplary calculate distortion measure process 158. In this alternate embodiment, loop initializations process 156 is performed for task 94 (FIG. 4) and calculate distortion measure process 158 is performed for transmittable codeword set of calculations 102 (FIG. 4).

The embodiment of Viterbi encode process 86 presented in FIG. 4 generally implements EQ. 1, presented above. The alternate embodiment of Viterbi encode process 86 generally implements an alternate form of EQ. 1, as follow:

$$d(x_j, y_{k,l}) = \qquad \text{EQ. 5}$$

$$x_j^2 \sum_{l=0}^{N_1-1} \sum_{n=0}^{N_2-1} P_{i,n|k,l} - 2x_j \sum_{i=0}^{N_1-1} \sum_{n=0}^{N_2-1} P_{i,n|k,l} y_{i,n} + \sum_{i=0}^{N_1-1} \sum_{n=0}^{N_2-1} P_{i,n|k,l} y_{i,n}^2$$

The terms within the summations in EQ. 5 are not a function of input samples and can therefore be calculated outside of the programming loop that is repeated for each sample in the sample set 70 processed by Viterbi process 86 (FIG. 4).

Loop initializations process 156 performed by task 94 (FIG. 4) is itself a programming loop that repeats certain calculations $C^2$ times, where C is the number of codewords in the current codebook 64. A task 160 performs any initializations useful to implementing this programming loop. Following task 160, tasks 162, 164, 166, and 168 respectively correspond to tasks 98, 100, 108, and 110 of Viterbi process 86 (FIG. 4) in sequencing and function. Task 162 increments the transmit subset index k, task 164 increments the transmit codeword index l, task 166 increments the receive subset index i, and task 168 increments the receive codeword index n. Tasks 162, 164, 166 and 168 provide entry points for four nested loops, with the innermost loop being entered following task 168 and being performed $C^2$ times.

Following task 168, a task 170 gets the hamming distance Hamming(n⊕l) between the transmit and receive codeword indices l and n. Next, a task 172 calculates the transition probability $P_{i,n/k,l}$ for the combination of transmittable and receivable codewords 90 (FIG. 5) indexed by the k, l, i and n indices. Task 172 performs this calculation using EQ. 2, discussed above. As discussed above, for encoding bit rates R>1, task 172 modifies the base channel transition probabilities into channel transition probabilities suitable for the current encoding bit rate R.

In one alternate embodiment, tasks 170 and 172 may be replaced with a table look-up operation that uses tables containing pre-calculated values for channel transition probabilities $P_{i,n/k,l}$. However, this alternate embodiment requires extensive memory dedicated to such a table for large values of encoding bit rates R.

After task 172, a task 174 uses the current codebook 64 and the channel transition probability $P_{i,n/k,l}$ calculated in task 172 to calculate the terms: $(P_{i,n/k,l})(y_{i,n})$ and $(P_{i,n/k,l})(y_{i,n})^2$ in EQ. 5. Following task 174, a task 176 accumulates $P_{i,n/k,l}$, $(P_{i,n/k,l})(y_{i,n})$, and $(P_{i,n/k,l})(y_{i,n})^2$ to form the cumulative totals $SUM(P_{k,l})$, $SUM(P_{k,l}Y)$, and $SUM(P_{k,l}Y^2)$, respectively. Then, a query task 178 tests for the last receive codeword and routes program flow back to task 168 until the last codeword for the current receive subset and transmit codeword is encountered. When such a last codeword is discovered, a query task 180 tests for the last receive subset and routes program flow back to task 166 until the last receive subset for the current transmit codeword is detected.

When the last receive subset is detected at task 180 the cumulative totals $SUM(P_{k,l})$, $SUM(P_{k,l}Y)$, and $SUM(P_{k,l}Y^2)$, have been accumulated over all received codewords for the specified transmit codeword. At this point, a task 182 saves the cumulative totals $SUM(P_{k,l})$, $SUM(P_{k,l}Y)$, and $SUM(P_{k,l}Y^2)$, and resets the accumulators so that cumulative totals can now be accumulated for another transmit codeword.

Following task 182, a query task 184 tests for the last transmit codeword and routes program flow back to task 164 until the last codeword of the current transmit subset is encountered. When such a last codeword is discovered, a query task 186 tests for the last transmit subset and routes program flow back to task 162 until the last transmit subset is detected. When the last transmit subset is encountered, the cumulative totals $SUM(P_{k,l})$, $SUM(P_{k,l}Y))$, and $SUM(P_{k,l}Y^2)$ for all possible transmittable codewords have been saved, and program control exits process 156.

Accordingly, each of the cumulative totals $SUM(P_{k,l})$, $SUM(P_{k,l}Y)$, and $SUM(P_{k,l}Y^2)$ are accumulated over all receivable codewords for each transmittable codeword. In other words, for each transmittable codeword, a receivable codeword set of calculations is performed to accumulate $SUM(P_{k,l})$, $SUM(P_{k,l}Y)$, and $SUM(P_{k,l}Y^2)$ cumulative totals. This receivable codeword set of calculations is performed once for each of the C transmittable codewords. However, once calculated, the receivable codeword set of calculations can be used for all J samples in the sample set 70 being processed by Viterbi encode process 86.

In particular, by using loop initializations process 156 (FIG. 9) in loop initializations task 94 in Viterbi encode process 86 (FIG. 4), the transmittable codeword set of calculations 102 (FIG. 4) can be greatly simplified. Calculate distortion measure process 158 (FIG. 10) may now be performed in lieu of the tasks illustrated for transmittable codeword set of calculations 102 illustrated in FIG. 4. Rather than performing C distortion measure $d(x_j,y_{k,l})$ calculations for each transmittable codeword $y_{k,l}$, where C is the number of codewords in the current codebook 64, a single distortion measure calculation may be determined, as follows:

$$d(x_j,y_{k,l})=x_j^2 SUM(P_{k,l})-2x_j SUM(P_{k,l}Y)+SUM(P_{k,l}Y^2) \qquad \text{EQ. 6}$$

Viterbi encode process 86 (FIG. 4) performs the EQ. 6 distortion measure calculation once for each transmittable codeword $y_{k,l}$. Accordingly, computational complexity has been reduced compared to the FIG. 4 embodiment of Viterbi encode process 86. The alternate embodiment Viterbi encode process 86 of FIGS. 9 and 10 may perform Viterbi encoding in the same amount of time using less power or more quickly using the same amount of power.

In summary, the present invention provides an improved communication system and method for multi-rate, channel optimized trellis-coded quantization (COTCQ). A communication system configured in accordance with the teaching of the present invention performs COTCQ using a wide variety of fixed encoding bit rates. Codebooks are configured in response to a bit error probability for the channel through which data are to be communicated.

Although the preferred embodiments of the present invention have been illustrated and described in detail, it will be readily apparent to those skilled in the art that various modifications and equivalents may be made therein without departing from the spirit of the invention or from the scope of the appended claims. For example, those skilled in the art will appreciate that the sequencing and grouping of tasks and the configuration of data formats discussed herein can be greatly altered while achieving equivalent results. These and other changes and modifications are intended to be included within the scope of the present invention.

What is claimed is:

1. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets;

a rate allocator coupled to said decomposer, said rate allocator being configured to associate different encoding bit rates with different ones of said sample sets;

a channel-optimized trellis-coded quantization (COTCQ) codebook table coupled to said rate allocator, wherein said COTCQ codebook table includes more than two COTCQ codebooks, and has at least one COTCQ codebook for each encoding bit rate that said rate allocator associates with said sample sets, wherein each COTCQ codebook in said COTCQ codebook table is responsive to said predetermined bit error probability and to one of said encoding bit rates which said rate allocator associates with said sample sets; and a modulator coupled to said COTCQ codebook table.

2. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets;

a rate allocator coupled to said decomposer, said rate allocator being configured to associate different encoding bit rates with different ones of said sample sets;

a channel-optimized trellis-coded quantization (COTCQ) codebook table coupled to said rate allocator and having at least one COTCQ codebook for each encoding bit rate that said rate allocator associates with said sample sets, wherein each COTCQ codebook in said COTCQ codebook table is responsive to said predetermined bit error probability and to one of said encoding bit rates which said rate allocator associates with said sample sets; and a modulator coupled to said COTCQ codebook table, wherein said COTCQ codebook table and said modulator are mutually configured so that all error correction encoding applied to said to-be-communicated data is applied through said COTCQ codebook table.

3. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets;

a rate allocator coupled to said decomposer, said rate allocator being configured to associate different encoding bit rates with different ones of said sample sets;

a channel-optimized trellis-coded quantization (COTCQ) codebook table coupled to said rate allocator and having at least one COTCQ codebook for each encoding bit rate that said rate allocator associates with said sample sets, wherein:

each COTCQ codebook in said COTCQ codebook table is responsive to said predetermined bit error probability and to one of said encoding bit rates which said rate allocator associates with said sample sets;

each of said COTQC codebooks is configured in response to a Viterbi encoding process for $2^Z$ states so that each of said COTQC codebooks is partitioned into $2^Z$ subsets of codewords, with $2^{R+1-Z}$ codewords per subset, where R and Z are integer numbers and R indicates an encoding bit rate for each of said COTQC codebooks;

each of said COTQC codebooks is configured in response to channel transition probabilities for all codewords receivable from said channel given all codewords transmittable through said channel; and said channel transition probabilities are responsive to said channel bit error probability; and a modulator coupled to said COTCQ codebook table.

4. A communication system as claimed in claim 3 wherein said channel transition probabilities for each of said COTQC codebooks are further responsive to base channel transition probabilities which result from an encoding bit rate of one bit per sample.

5. A communication system as claimed in claim 4 wherein:

a first index having a binary expression presented in R+1−Z bits identifies transmittable codewords within said subsets of codewords;

a second index having a binary expression presented in R+1−Z bits identifies receivable codewords within said subsets of codewords; and said channel transition probabilities for encoding bit rates greater than one bit per sample are further responsive to a hamming distance between said first index and said second index.

6. A communication system as claimed in claim 5 wherein said channel transition probabilities are further configured substantially so that, for each of said encoding bit rates:

$$P_{i,n|k,l} = P_{i,0|k,0}^{R-1}(1-P_b)^{R+1-Z-Hamming(l \oplus n)} P_b^{Hamming(l \oplus n)}$$

where l and n are said first and second indices, respectively, $P_{i,n|k,l}$ indicates a channel transition probability for an $n^{th}$ codeword in an $i^{th}$ subset being received given that an $l^{th}$ codeword in a $k^{th}$ subset was transmitted, $P^{(R=1)}_{i,0|k,0}$ indicates a base channel transition probability for an encoded rate of one (R=1), which has one codeword per subset, for said $i^{th}$ subset codeword being received given that said $k^{th}$ subset codeword was transmitted, and Hamming(l⊕n) is a hamming distance between l and n expressed as binary numbers.

7. A communication system as claimed in claim 5 wherein said integer Z equals two.

8. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets;

a rate allocator coupled to said decomposer, said rate allocator being configured to associate different encoding bit rates with different ones of said sample sets;

a channel-optimized trellis-coded quantization (COTCQ) codebook table coupled to said rate allocator and having at least one COTCQ codebook for each encoding bit rate that said rate allocator associates with said sample sets, wherein each COTCQ codebook in said COTCQ codebook table is responsive to said predetermined bit error probability and to one of said encoding bit rates which said rate allocator associates with said sample sets;

a modulator coupled to said COTCQ codebook table; and a processor coupled to said at least one COTCQ codebook for each encoding bit rate and configured to calculate hamming distances between indices for transmittable and receivable codewords of said at least one COTCQ codebook for each encoding bit rate.

9. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets, wherein each of said sample sets includes a number J of samples, where J is any integer number;

a rate allocator coupled to said decomposer, said rate allocator being configured to associate different encoding bit rates with different ones of said sample sets;

a channel-optimized trellis-coded quantization (COTCQ) codebook table coupled to said rate allocator and having at least one COTCQ codebook for each encoding bit rate that said rate allocator associates with said sample sets, wherein each COTCQ codebook in said COTCQ codebook table is responsive to said predetermined bit error probability and to one of said encoding bit rates which said rate allocator associates with said sample sets, and wherein each COTCQ codebook includes a number C of codewords, where C is an integer responsive to said encoding bit rate for said COTCQ codebook;

a modulator coupled to said COTCQ codebook table; and a processor coupled to said at least one COTCQ codebook for each encoding bit rate, said processor being configured, at each encoding bit rate, to perform a receivable codeword set of calculations which are performed substantially once for each of said C codewords and used in processing all J samples, and a transmittable codeword set of calculations which are performed substantially once for each of said C codewords then repeated for each of said J samples.

10. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets;

a rate allocator coupled to said decomposer, said rate allocator being configured to associate different encoding bit rates with different ones of said sample sets;

a channel-optimized trellis-coded quantization (COTCQ) codebook table coupled to said rate allocator and having at least one COTCQ codebook is configured for a fixed encoding bit rate that said rate allocator associates with said sample sets, and wherein each COTCQ codebook in said COTCQ codebook table is responsive to said predetermined bit error probability and to one of said encoding bit rates which said rate allocator associates with said sample sets; and a modulator coupled to said COTCQ codebook table.

11. A communication system which communicates through a channel having a predetermined bit error probability less than a worst-case bit error probability for said channel, said system comprising:

a decomposer configured to decompose to-be-communicated data into a plurality of transform coefficients each of which is characterized by samples, said samples being grouped into sample sets;

a rate allocator coupled to said decomposer, said rate allocator being configured to associate different encoding bit rates with different ones of said sample sets;

a channel-optimized trellis-coded quantization (COTCQ) codebook table coupled to said rate allocator and having at least one COTCQ codebook for each encoding bit rate that said rate allocator associates with said sample sets, wherein each COTCQ codebook in said COTCQ codebook table is responsive to said predetermined bit error probability and to one of said encoding bit rates which said rate allocator associates with said sample sets; and a modulator coupled to said COTCQ codebook table, wherein said decomposer, rate allocator, COTCQ codebook table, and modulator are energized by a battery, and said modulator is configured to broadcast an over-the-air radio frequency signal.

12. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients, wherein said pool of different encoding bit rates includes more than two encoding bit rates;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data; and transmitting said encoded data.

13. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients, wherein said pool of different encoding bit rates includes at least seven encoding bit rates;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data; and transmitting said encoded data.

14. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein each of said channel-optimized trellis-coded quantization codebooks is configured in response to said predetermined bit error probability, wherein said configuring activity identifies a plurality of said predetermined bit error probabilities, and said configuring activity, for each of said different encoding bit rates, configures a channel-optimized trellis-coded quantization codebook in response one of said plurality of said predetermined bit error probabilities;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data; and transmitting said encoded data.

15. A method as claimed in claim 14 wherein said configuring activity, for each of said plurality of said predetermined bit error probabilities, configures a channel-optimized trellis-coded quantization codebook in response to one of said plurality of encoding bit rates.

16. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data, wherein said encoding activity comprises refraining from applying error correction encoding to said encoded data; and transmitting said encoded data.

17. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein:

each of said channel-optimized trellis-coded quantization codebooks is configured in response to said predetermined bit error probability;

said configuring activity configures each of said codebooks in response to a Viterbi encoding process for $2^Z$ states so that each of said channel-optimized trellis-coded quantization codebooks is partitioned into $2^Z$ subsets of codewords, with $2^{R+1-Z}$ codewords per subset, where R and Z are integer numbers and R indicates an encoding bit rate for each of said codebooks;

said configuring activity configures each of said channel-optimized trellis-coded quantization codebooks in response to channel transition probabilities for all codewords receivable from said channel given all codewords transmittable through said channel; and said channel transition probabilities are responsive to said channel bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data; and transmitting said encoded data.

18. A method as claimed in claim 17 wherein:

said pool of encoding bit rates includes at least one encoding bit rate R greater than one bit per sample; and said channel transition probabilities are further responsive to base channel transition probabilities resulting from an encoding bit rate of one bit per sample.

19. A method as claimed in claim 18 wherein:

a first index having a binary expression presented in R+1−Z bits identifies transmittable codewords within said subsets of codewords;

a second index having a binary expression presented in R+1−Z bits identifies receivable codewords within said subsets of codewords; and said channel transition probabilities are further responsive to a hamming distance between said first index and said second index.

20. A method as claimed in claim 19 wherein said channel transition probabilities are further configured substantially so that, for each of said encoding bit rates (R) in said pool of encoding bit rates:

$$P_{i,n|k,l} = P_{i,0|k,0}^{R-1}(1-P_b)^{R+1-Z-Hamming(l \oplus n)} P_b^{Hamming(l \oplus n)}$$

where l and n are said first and second indices, respectively, $P_{i,n|k,l}$ indicates a channel transition probability for an $n^{th}$ codeword in an $i^{th}$ subset being received given that an $l^{th}$ codeword in a $k^{th}$ subset was transmitted, $P^{(R=1)}_{i,0|k,0}$ indicates a base channel transition probability for an encoded rate of one, which has one codeword per subset, for said $i^{th}$ subset codeword being received given that said $k^{th}$ subset codeword was transmitted, and Hamming(l⊕n) is a hamming distance between l and n expressed as binary numbers.

21. A method as claimed in claim 20 wherein said integer Z equals two.

22. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data characterizing an image; and transmitting said encoded data.

23. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data;

transmitting side information which characterizes a mean of samples for a lowest frequency one of said transform coefficients and standard deviations for said samples characterizing said transform coefficients, said side information being transmitted without encoding in accordance with said channel-optimized trellis-coded quantization codebooks; and transmitting said encoded data.

24. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data, wherein said encoding activity is configured to calculate hamming distances between indices for transmittable and receivable codewords of said channel-optimized trellis-coded quantization codebooks; and transmitting said encoded data.

25. A method of communicating data through a channel having a predetermined bit error probability less than a worst-case bit error probability for said channel, said method comprising:

decomposing said data into transform coefficients characterized by samples;

allocating different encoding bit rates from a pool of encoding bit rates to different ones of said transform coefficients;

configuring a channel-optimized trellis-coded quantization codebook for each of said plurality of different encoding bit rates, wherein each of said channel-optimized trellis-coded quantization codebooks is configured in response to said predetermined bit error probability;

selecting, for each of said plurality of different encoding bit rates, one of said channel-optimized trellis-coded quantization codebooks;

encoding, for each of said plurality of different encoding bit rates, at least a portion of said samples using said one of said channel-optimized trellis-coded quantization codebooks to generate encoded data, wherein said encoding activity encodes a number J of said samples for each encoding bit rate, where J is any integer number, wherein each channel-optimized trellis-coded quantization codebook includes a number C of codewords, where C is an integer which is responsive to said encoding bit rate, and wherein said encoding activity comprises:

performing a receivable codeword set of calculations which are performed substantially once for each of said C codewords and used in processing all J samples; and performing a transmittable codeword set of calculations which are performed substantially once for each of said C codewords then repeated for each of said J samples; and transmitting said encoded data.

26. A method of forming a channel-optimized trellis-coded quantization (COTCQ) codebook table having more than two COTCQ codebooks, said method comprising:

a) identifying a first encoding bit rate (R) at which real data are to be encoded in accordance with said codebook table, a channel bit error probability for a channel through which real data are to be transmitted, a Viterbi encoding process having $2^Z$ states so that said COTCQ codebooks each have $2^Z$ subsets of codewords, with $2^{R+1-Z}$ codewords per subset, and a first COTCQ codebook, where R and Z are positive integer numbers;

b) calculating channel transition probabilities for all codewords receivable from said channel given transmission of all codewords transmittable through said channel, said channel transition probabilities being responsive to said channel bit error probability;

c) encoding training data in accordance with said Viterbi encoding process, said first encoding bit rate, and said first COTCQ codebook to generate test data clusters;

d) revising said first COTCQ codebook in response to said test data clusters to produce a revised COTCQ codebook;

e) determining distortion resulting from quantization error encountered in said step c) and from channel transition probabilities determined in said step b);

f) repeating said steps c), d), and e) using revised COTCQ codebooks until said distortion is below a predetermined threshold; and g) repeating said steps a), b), c), d), e) and f) for at least two additional encoding bit rates.

27. A method as claimed in claim 26 wherein said step b) comprises, for encoding bit rates greater than one bit per sample, the steps of:

determining base channel transition probabilities for all codewords receivable from said channel given transmission of all codewords transmittable through said channel at an encoding bit rate of one bit per sample; and modifying said base channel transition probabilities into channel transition probabilities for said encoding bit rates greater than one bit per sample.

28. A method as claimed in claim 27 wherein:

a first index having a binary expression presented in R+1−Z bits identifies transmittable codewords within said $2^Z$ subsets of codewords;

a second index having a binary expression presented in R+1−Z bits identifies receivable codewords within said $2^Z$ subsets of codewords; and said channel transition probabilities for said encoding bit rates greater than one bit per sample are further responsive to a hamming distance between said first index and said second index.

29. A method as claimed in claim 28 wherein said step b) substantially establishes, for each of said encoding bit rates:

$$P_{i,n|k,l} = P_{i,0|k,0}^{R-1}(1-P_b)^{R+1-Z-Hamming(l \oplus n)} P_b^{Hamming(l \oplus n)}$$

where $P_b$ is said channel bit error probability, l and n are said first and second indices, respectively, $P_{i,n|k,l}$ indicates a channel transition probability for an $n^{th}$ codeword in an $i^{th}$ subset being received given that an $l^{th}$ codeword in a $k^{th}$ subset was transmitted, $P^{(R=1)}_{i,0|k,0}$ indicates a base channel transition probability for an encoded rate of one (R=1), which has one codeword per subset, for said $i^{th}$ subset codeword being received given that said $k^{th}$ subset codeword was transmitted, and Hamming(l⊕n) is a hamming distance between l and n expressed as binary numbers.

30. A method as claimed in claim 29 wherein said integer Z equals two.

31. A method as claimed in claim 26 wherein:

said channel bit error probability is a first channel bit error probability; and said method additionally comprises the step of repeating said steps a), b), c), d), e), f) and g) for alternate channel bit error probabilities.

32. A method as claimed in claim 26 additionally comprising the step of including each revised COTCQ codebook resulting in said distortion being below said predetermined threshold in said codebook table.

33. A method as claimed in claim 26 wherein said step g) repeats said steps a), b), c), d), e) and f) for at least six additional encoding bit rates.

34. A method as claimed in claim 26 wherein:

said channel bit error probability is a first channel bit error probability; and said first COTCQ codebook is a COTCQ codebook configured for said first encoding bit rate and a second channel bit error probability, said second channel bit error probability being less than said first channel bit error probability.

35. A communication system having a channel-optimized trellis-coded quantization (COTCQ) codebook table formed in accordance with the method of claim 26.

* * * * *

UNITED STATES PATENT AND TRADEMARK OFFICE
CERTIFICATE OF CORRECTION

PATENT NO. : 6,717,990 B1
DATED : April 6, 2004
INVENTOR(S) : Glen P. Abousleman, Tuyet-Trang Lam and Lina Jamil Karam It is certified that error appears in the above-identified patent and that said Letters Patent is hereby corrected as shown below:

<u>Title page,</u>
Item [75], Inventors, please add the names of the following two inventors:

-- Tuyet-Trang Lam, Tempe, AZ; and
  Lina Jamil Karam, Phoenix, AZ. --

Signed and Sealed this

Thirteenth Day of July, 2004

JON W. DUDAS
*Acting Director of the United States Patent and Trademark Office*